US008816218B2

(12) United States Patent
Hurwitz

(10) Patent No.: US 8,816,218 B2
(45) Date of Patent: Aug. 26, 2014

(54) MULTILAYER ELECTRONIC STRUCTURES WITH VIAS HAVING DIFFERENT DIMENSIONS

(75) Inventor: Dror Hurwitz, Zhuhai (CN)

(73) Assignee: Zhuhai Advanced Chip Carriers & Electronic Substrate Solutions Technologies Co. Ltd., Zhuhai (CN)

( * ) Notice: Subject to any disclaimer, the term of this patent is extended or adjusted under 35 U.S.C. 154(b) by 190 days.

(21) Appl. No.: 13/482,074

(22) Filed: May 29, 2012

(65) Prior Publication Data

US 2013/0319747 A1 Dec. 5, 2013

(51) Int. Cl.
*H05K 1/11* (2006.01)
*H05K 3/46* (2006.01)

(52) U.S. Cl.
CPC ... *H05K 1/11* (2013.01); *H05K 3/46* (2013.01)
USPC .................. 174/262; 156/60; 216/20

(58) Field of Classification Search
CPC ........... H05K 1/11; H05K 3/46; H05K 1/112; H05K 3/429; H05K 2201/096; H05K 1/115; H05K 3/4602
USPC .................. 174/262; 156/60; 216/20
See application file for complete search history.

(56) References Cited

U.S. PATENT DOCUMENTS

| 6,713,685 B1 * | 3/2004 | Cotton .......................... 174/262 |
| 6,946,692 B1 * | 9/2005 | Hsu ................................ 257/211 |
| 7,635,641 B2 | 12/2009 | Hurwitz et al. | |
| 7,669,320 B2 * | 3/2010 | Hurwitz et al. ................. 29/846 |
| 7,682,972 B2 * | 3/2010 | Hurwitz et al. ............... 438/672 |
| 8,163,642 B1 * | 4/2012 | Wang ............................ 438/626 |

FOREIGN PATENT DOCUMENTS

| KR | 10-2006-0079428 | 7/2006 |
| KR | 10-2008-0084800 | 9/2008 |
| WO | 2007/043056 | 4/2007 |

* cited by examiner

*Primary Examiner* — Timothy Thompson
*Assistant Examiner* — Charles Pizzuto
(74) *Attorney, Agent, or Firm* — Wiggin and Dana LLP; Gregory S. Rosenblatt

(57) ABSTRACT

A multilayer composite electronic structure comprising at least two feature layers extending in an X-Y plane and separated by a via layer comprising a dielectric material that is sandwiched between two adjacent feature layers, the via layer comprising via posts that couple adjacent feature layers in a Z direction perpendicular to the X-Y plane, wherein a first via has different dimensions in the X-Y plane from a second via in the via layer.

20 Claims, 4 Drawing Sheets

MULTILAYER ELECTRONIC STRUCTURES WITH VIAS HAVING DIFFERENT DIMENSIONS

BACKGROUND

1. Field of the Disclosure

The present invention is directed to multilayer interconnect structures including novel vias having different shapes and sizes.

2. Description of the Related Art

Driven by an ever greater demand for miniaturization of ever more complex electronic components, consumer electronics such as computing and telecommunication devices are becoming more integrated. This has created a need for support structures such as IC substrates and IC interposers that have a high density of multiple conductive layers and vias that are electrically insulated from each other by a dielectric material.

The general requirement for such support structures is reliability and appropriate electrical performance, thinness, stiffness, planarity, good heat dissipation and a competitive unit price.

Of the various approaches for achieving these requirements, one widely implemented manufacturing technique that creates interconnecting vias between layers uses lasers to drill holes through the subsequently laid down dielectric substrate through to the latest metal layer for subsequent filling with a metal, usually copper, that is deposited therein by a plating technique. This approach to creating vias is sometimes referred to as 'drill & fill', and the vias created thereby may be referred to as 'drilled & filled vias'.

There are a number of disadvantages with the drilled & filled via approach. Since each via is required to be separately drilled, the throughput rate is limited, and the costs of fabricating sophisticated, multi-via IC substrates and interposers becomes prohibitive. In large arrays it is difficult to produce a high density of high quality vias having different sizes and shapes in close proximity to each other by the drill & fill methodology. Furthermore, laser drilled vias have rough sides walls and taper inwards through the thickness of the dielectric material. This tapering reduces the effective diameter of the via. It may also adversely affect the electrical contact to the previous conductive metal layer especially at ultra small via diameters, thereby causing reliability issues. Additionally, the side walls are particularly rough where the dielectric being drilled is a composite material comprising glass or ceramic fibers in a polymer matrix, and this roughness may create additional stray inductances.

The filling process of the drilled via holes is usually achieved by copper electroplating. The electroplating deposition technique may result in dimpling, where a small crater appears at the top of the via. Alternatively, overfill may result, where a via channel is filled with more copper than it can hold, and a domed upper surface that protrudes over the surrounding material is created. Both dimpling and overfill tend to create difficulties when subsequently stacking vias one on top of the other, as required when fabricating high-density substrates and interposers. Furthermore, it will be appreciated that large via channels are difficult to fill uniformly, especially when they are in proximity to smaller vias within the same interconnecting layer of the interposer or IC substrate design.

Although the range of acceptable sizes and reliability is improving over time, the disadvantages described hereinabove are intrinsic to the drill & fill technology and are expected to limit the range of possible via sizes. It will further be noted that laser drilling is best for creating round via channels. Although slot shaped via channels may theoretically be fabricated by laser milling, in practice, the range of geometries that may be fabricated is somewhat limited and vias in a given support structure are typically cylindrical and substantially identical.

Fabrication of vias by drill & fill is expensive and it is difficult to evenly and consistently fill the via channels created thereby with copper using the relatively, cost-effective electroplating process.

Laser drilled vias in composite dielectric materials are practically limited to $60 \times 10^{-6}$ m diameter, and even so suffer from significant tapering shape as well as rough side walls due to the nature of the composite material drilled, in consequence of the ablation process involved.

In addition to the other limitations of laser drilling as described hereinabove, there is a further limitation of the drill & fill technology in that it is difficult to create different diameter vias in the same layer, since when drill different sized via channels are drilled and then filled with metal to fabricate different sized vias, the via channels fill up at different rates. Consequently, the typical problems of dimpling or overfill that characterize drill & fill technology are exasperated, since it is impossible to simultaneously optimize deposition techniques for different sized vias.

An alternative solution that overcomes many of the disadvantages of the drill & fill approach, is to fabricate vias by depositing copper or other metal into a pattern created in a photo-resist, using a technology otherwise known as 'pattern plating'.

In pattern plating, a seed layer is first deposited. Then a layer of photo-resist is deposited thereover and subsequently exposed to create a pattern, and selectively removed to make trenches that expose the seed layer. Via posts are created by depositing Copper into the photo-resist trenches. The remaining photo-resist is then removed, the seed layer is etched away, and a dielectric material that is typically a polymer impregnated glass fiber mat, is laminated thereover and therearound to encase the vias posts. Various techniques and processes can be then use to planarize the dielectric material, removing part of it to expose the tops of the via posts to allow conductive connection to ground thereby, for building up the next metal layer thereupon. Subsequent layers of metal conductors and via posts may be deposited there onto by repeating the process to build up a desired multilayer structure.

In an alternative but closely linked technology, known hereinafter as 'panel plating', a continuous layer of metal or alloy is deposited onto a substrate. A layer of photo-resist is deposited on top of the substrate, and a pattern is developed therein. The pattern of developed photo-resist is stripped away, selectively exposing the metal thereunder, which may then be etched away. The undeveloped photo-resist protects the underlying metal from being etched away, and leaves a pattern of upstanding features and vias.

After stripping away the undeveloped photo-resist, a dielectric material, such as a polymer impregnated glass fiber mat, may be laminated around and over the upstanding copper features and/or via posts. After planarizing, subsequent layers of metal conductors and via posts may be deposited there onto by repeating the process to build up a desired multilayer structure.

The via layers created by pattern plating or panel plating methodologies described above are typically known as 'via posts' and feature layers from copper.

It will be appreciated that the general thrust of the microelectronic evolution is directed towards fabricating ever smaller, thinner and lighter and more powerful products having high reliability. The use of thick, cored interconnects, prevents ultra-thin products being attainable. To create ever higher densities of structures in the interconnect IC substrate or 'interposer', ever more layers of ever smaller connections are required. Indeed, sometimes it is desirable to stack components on top of each other.

If plated, laminated structures are deposited on a copper or other appropriate sacrificial substrate, the substrate may be etched away leaving free standing, coreless laminar structures. Further layers may be deposited on the side previously adhered to the sacrificial substrate, thereby enabling a two sided build up, which minimizes warping and aids the attaining of planarity.

One flexible technology for fabricating high density interconnects is to build up pattern or panel plated multilayer structures consisting of metal vias or features in a dielectric matrix. The metal may be copper and the dielectric may be a fiber reinforced polymer, typically a polymer with a high glass transition temperature ($T_g$) is used, such as polyimide, for example. These interconnects may be cored or coreless, and may include cavities for stacking components. They may have odd or even numbers of layers. Enabling technology is described in previous patents issued to Amitec-Advanced Multilayer Interconnect Technologies Ltd.

For example, U.S. Pat. No. 7,682,972 to Hurwitz et al. titled "Advanced multilayer coreless support structures and method for their fabrication" describes a method of fabricating a free standing membrane including a via array in a dielectric, for use as a precursor in the construction of superior electronic support structures, includes the steps of fabricating a membrane of conductive vias in a dielectric surround on a sacrificial carrier, and detaching the membrane from the sacrificial carrier to form a free standing laminated array. An electronic substrate based on such a free standing membrane may be formed by thinning and planarizing the laminated array, followed by terminating the vias. This publication is incorporated herein by reference in its entirety.

U.S. Pat. No. 7,669,320 to Hurwitz et al. titled "Coreless cavity substrates for chip packaging and their fabrication" describes a method for fabricating an IC support for supporting a first IC die connected in series with a second IC die; the IC support comprising a stack of alternating layers of copper features and vias in insulating surround, the first IC die being bondable onto the IC support, and the second IC die being bondable within a cavity inside the IC support, wherein the cavity is formed by etching away a copper base and selectively etching away built up copper. This publication is incorporated herein by reference in its entirety.

U.S. Pat. No. 7,635,641 to Hurwitz et al. titled "integrated circuit support structures and their fabrication" describes a method of fabricating an electronic substrate comprising the steps of (A) selecting a first base layer; (B) depositing a first etchant resistant barrier layer onto the first base layer; (C) building up a first half stack of alternating conductive layers and insulating layers, the conductive layers being interconnected by vias through the insulating layers; (D) applying a second base layer onto the first half stack; (E) applying a protective coating of photo-resist to the second base layer; (F) etching away the first base layer; (G) removing the protective coating of photo-resist ; (H) removing the first etchant resistant barrier layer; (I) building up a second half stack of alternating conductive layers and insulating layers, the conductive layers being interconnected by vias through the insulating layers, wherein the second half stack has a substantially symmetrical lay up to the first half stack; (J) applying an insulating layer onto the second hall stack of alternating conductive layers and insulating layers, (K) removing the second base layer, and (L) terminating the substrate by exposing ends of vias on outer surfaces of the stack and applying terminations thereto. This publication is incorporated herein by reference in its entirety.

BRIEF SUMMARY

A first aspect of the invention is directed to providing a multilayer composite electronic structure comprising at least two feature layers extending in an X-Y plane and separated by a via layer comprising a dielectric material that is sandwiched between two adjacent feature layers, the via layer comprising via posts that couple adjacent feature layers in a Z direction perpendicular to the X-Y plane, wherein a first via post has different dimensions in the X-Y plane from a second via post in the via layer.

Optionally, at least one of said via posts is substantially non-cylindrical.

Optionally, the at least one via post comprises a seed layer covered by a metal layer deposited thereover by electroplating.

Optionally, the seed layer comprises copper.

Typically, the metal layer comprises copper.

In some embodiments, the seed layer further comprises an adhesive metal layer first laid down to promote adhesion to the dielectric material.

In some embodiments, the adhesive metal layer comprises at least one of the group comprising titanium, chromium, tantalum and tungsten.

Optionally, the smallest dimension in the X-Y plane of a first via is at least 20% larger than the smallest dimension in the X-Y plane of a second via in the same plane.

Optionally, a smallest dimension in the X-Y plane of a third via is at least 20% larger than the smallest dimension in the X-Y plane of the first via.

Optionally, at least one via has a circular cross-section in the X-Y plane.

Optionally, at least one via has a non-circular cross-section in the X-Y plane.

In some embodiments, at least one via has a square cross-section in the X-Y plane.

In some embodiments, at least one via is asymmetrical in the X-Y plane, having a linear shape.

In some embodiments, at least one via at least one via is asymmetrical in the X-Y plane, extending in a first direction in the X-Y plane, at least three times the extension in a second direction in the X-Y plane that is perpendicular to the first direction.

In some embodiments, at least one via has a diameter of less than 50 microns.

In some embodiments, at least one via has a diameter of less than 40 microns.

In some embodiments, at least one via has a diameter of 30 microns or less.

In some embodiments, the thickness of the structure in the Z direction exceeds 50 microns.

In some embodiments, a feature layer and the at least one via layer may be fabricated by a process comprising the steps of:

(a) obtaining a substrate including an underlying via layer that is treated to expose the copper thereof; (b) covering the substrate with a seed layer; (c) applying a first layer of photoresist over the seed layer; (d) exposing and developing the photoresist to form a negative pattern of features; (e) depositing metal into the negative pattern to fabricate the feature layer; (f) stripping away the first layer of photoresist; (g) applying a second layer of photoresist; (h) exposing and developing a negative pattern including at least two via posts of different dimensions in the negative pattern; (e) depositing a metal layer into the negative pattern; (f) stripping away the photoresist leaving the feature layer and the at least two via posts of different dimensions in the via layer upstanding; (k) removing the seed layer, (l) laminating a dielectric material over the at least two via posts in the via layer.

Typically, at least one of the following limitations applies: (i) the seed layer comprises copper; (ii) the metal layer comprises copper; (iii) the dielectric material comprises a polymer, and (iv) the dielectric material further comprises ceramic or glass inclusions.

Optionally, at least one of the following limitations applies: (i) the polymer comprises polyimide, epoxy, Bismaleimide, Triazine and blends thereof; (ii) the inclusions comprise glass fibers, and (iii) the inclusions comprise ceramic particle fillers.

The process may comprise the further step: (m) planarizing to expose the metal.

The method may comprise the further step: (n) depositing a metal seed layer over the ground surface.

Optionally, the metal seed layer comprises copper.

In some embodiments, the at least one via layer is fabricated by the steps of:
(i) obtaining a substrate including an underlying feature layer where the copper thereof is exposed; (ii) covering the substrate with a seed layer; (iii) depositing a metal layer over the seed layer; (iv) applying a layer of photoresist over the metal layer; (v) exposing and developing a positive pattern of vias; (vi) etching away the metal layer exposed; (vii) stripping away the photoresist, leaving at least two vias of different dimensions in the via layer upstanding, (viii) removing the seed layer, and (xi) laminating a dielectric material over the at least two vias.

Typically, at least one of the following limitations applies: (a) the seed layer comprises copper; (b) the metal layer comprises copper; (c) the dielectric material comprises a polymer, and (d) the dielectric material further comprises ceramic or glass inclusions.

Optionally, at least one of the following limitations applies: (e) the polymer comprises polyimide, epoxy, Bismaleimide, Triazine and blends thereof; (f) the inclusions comprise glass fibers, and (g) the inclusions comprise ceramic fillers.

The method may comprise the further step: (x) planarizing and thinning to expose the metal.

The method may comprise the further step: (xi) depositing a metal seed layer over the thinned surface.

Optionally, the metal seed layer comprises copper.

The term microns or μm refers to micrometers, or $10^{-6}$ m.

BRIEF DESCRIPTION OF THE DRAWINGS

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings.

Like reference numbers and designations in the various drawings indicated like elements.

DETAILED DESCRIPTION

In the description hereinbelow, support structures consisting of metal vias in a dielectric matrix, particularly, copper via posts in a polymer matrix, such as polyimide, epoxy or BT (Bismaleimide/Triazine) or their blends, reinforced with glass fibers are considered.

It is a feature of Access' photo-resist and pattern or panel plating and laminating technology, as described in U.S. Pat. Nos. 7,682,972, 7,669,320 and 7,635,641 to Hurwitz et al., incorporated herein by reference, that there is no effective upper limit to the in-plane dimensions of a feature.

Figure 1:
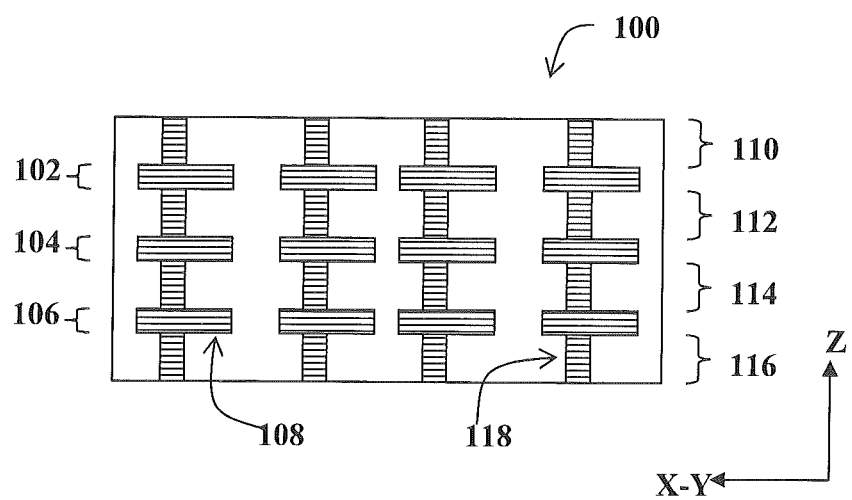
FIG. 1 is a simplified section through a multilayer composite support structure of the prior art.

FIG. 1 is a simplified section through a multilayer composite support structure of the prior art. Multilayer support structures 100 of the prior art include functional layers 102, 104, 106 of components or features 108 separated by layers of dielectric 110, 112, 114, 116, which insulate the individual layers. Vias 118 through the dielectric layer provide electrical connection between the adjacent functional or feature layers. Thus the feature layers 102, 104, 106 include features 108 generally laid out within the layer, in the X-Y plane, and vias 118 that conduct current across the dielectric layers 110, 112, 114, 116. Vias 118 are designed to have minimal inductance and are sufficiently separated to have minimum capacitances therebetween.

Where vias are fabricated with drill & fill technology, the vias generally have a substantially circular cross-section, as they are fabricated by first drilling a laser hole in the dielectric. Since the dielectric is heterogeneous and anisotropic, and consists of a polymer matrix with inorganic fillers and glass fiber reinforcements, the circular cross-section thereof is typically rough edged and the cross-sections thereof may be slightly distorted from a true circular shape. Furthermore, the vias tend to taper somewhat, being inverse frusto-conical instead of cylindrical.

As described in U.S. Pat. Nos. 7,682,972, 7,669,320 and 7,635,641, for example, the structure of FIG. 1 may alternatively be fabricated by plating in a pattern in a photo-resist (pattern plating), or panel plating and then selectively etching, either way leaving up standing via posts, and then laminating a dielectric pre-preg thereover.

Using the 'drilled and filled via' approach, it becomes prohibitive to fabricate non-circular vias due to difficulties in cross-section control and shape. There is also a minimum via size of about 50-60 micron diameter due to the limitations of the laser drilling. These difficulties were described at length in the background section hereinabove and are related, inter-alia, to dimpling and/or domed shaping that result from the copper via fill electro-plating process, via tapering shape and side wall roughness that result from the laser drilling process and higher cost that results from using the expensive laser drilling machine for milling slots, in a 'routing' mode to generate trenches in the polymer/glass dielectrics.

In addition to the other limitations of laser drilling as described hereinabove, there is a further limitation of the drill & fill technology in that it is difficult to create different diameter vias in the same layer, since when drill different sized via channels are drilled and then filled with metal to fabricate different sized vias, the via channels fill up at different rates. Consequently, the typical problems of dimpling or overfill (doming) that characterize drill & fill technology are exasperated, since it is impossible to simultaneously optimize deposition techniques for different sized vias. Thus in practical applications, drill and fill vias have substantially circular cross-sections albeit sometimes distorted somewhat due to the heterogeneous nature of the substrate, and all vias have substantially similar cross-sections.

Furthermore, it will be noted that laser drilled vias in composite dielectric materials such as polyimide/glass or epoxy/glass or BT (Bismaleimide/Triazine)/glass or their blends with ceramic and/or other filler particles, are practically limited to about $60 \times 10^{-6}$ m diameter, and even so suffer from significant tapering shape as well as rough side walls due to the nature of the composite material drilled, in consequence of the ablation process involved.

It has been surprisingly found that using the flexibility of the plating and photo-resist techniques, a wide range of via shapes and sizes may be cost-effectively fabricated. Furthermore, different via shapes and sizes may be fabricated in the same layer. This is especially facilitated when the copper pattern plating approach is used, by first depositing a metal seed layer and then depositing a photo-resist material and developing smooth, straight, non-tapering trenches therein which may subsequently be filled by depositing copper into these trenches by pattern plating onto the exposed seed layer. In contrast to the drilled & filled via approach, via post technology enables trenches in a photoresist layer to be filled to obtain dimple-less and dome-less copper connectors. After deposition of the copper, the photoresist is subsequent stripped away, the metal seed layer is removed and a permanent, polymer-glass dielectric is applied thereover and therearound. The 'via conductor' structure thus created may use the process flows as described in U.S. Pat. Nos. 7,682,972, 7,669,320 and 7,635,641 to Hurwitz et al.

Figure 2:
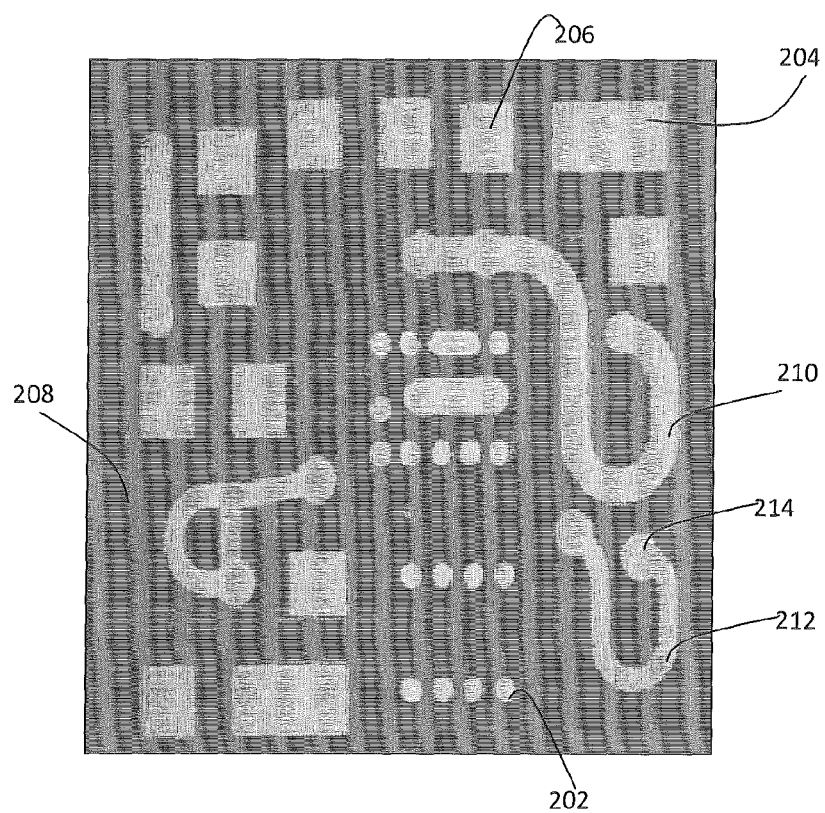
FIG. 2 is a micrograph of a section through a via layer in the X-Y plane, showing large square vias, extensive vias and micro-vias and illustrating the range of shapes and sizes that may be fabricated.

With reference to FIG. 2, a micrograph of a section in the X-Y plane, through a via layer is shown to illustrate this, providing proof-of-concept. Micro-vias 202 having diameters of approximately 30 microns are shown. Drill and fill technology does not allow fabrication of such small vias, and the current state of the art has an effective lower limit of about 60 micron diameter for drill and fill vias. The separation between the micro-vias may be less than 20 microns. Also shown, are fairly massive rectangular heat sinks 204 and square vias 206 that may be 120 microns×120 microns or so. As shown, the rectangular and square vias and heat sinks may have square corners, having a radius of curvature of only 2 or 3 microns. It will be appreciated that it is impossible to create tight corners using drilling technology. Although the plating technique facilitates their fabrication, typically square corners are avoided, since they may act as stress concentrators. The vias are embedded in a dielectric material 208 that is typically a polymer reinforced with glass fibers and may include inorganic fillers. Such dielectric materials may be available as woven fiber pre-pregs.

Extended via components 210 are also shown. The extended via components 210 may connect different features in neighboring layers and may serve as in-plane signal carriers. Thus components within a via layer may serve to couple components in different positions within the X-Y plane, and may be functional components. For example component 212 connects rounded vias 214 which may themselves be coupled to features in different layers. It will be noted that quite complex shapes may be fabricated, and so in plane vias may be curled around straight vias coupling features in adjacent layers.

Figure 3:
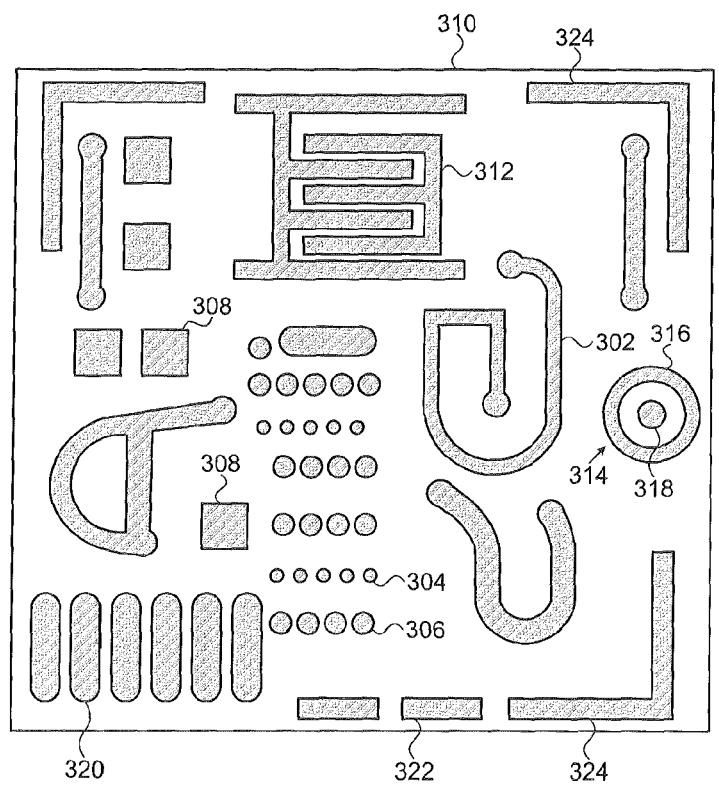
FIG. 3 is an annotated schematic plan view of a range of features obtainable.

FIG. 3 is a schematic plan view of shaped vias, such as those shown in FIG. 2, for example. In contradistinction to vias fabricated by the 'drill & fill' approach, it is a feature of Access' photoresist and pattern or panel plating and laminating technology, as described in U.S. Pat. Nos. 7,682,972, 7,669,320 and 7,635,641 to Hurwitz et al., incorporated herein by reference, that there is no effective upper limit to the in-plane dimensions of a feature. Currently, at the time of writing, the effective smallest diameter vias are about 30 microns, but this smallest size limit is expected to decrease further over time.

In contradistinction to vias of the prior art which serve merely to conduct signals between different feature layers and are fabricated by laser drilling, which provides substantially identical via shapes, it will be noted that in embodiments of the present invention, a first via may have very different dimensions in the X-Y plane from a second via in the same via layer. The vias may serve as heat sinks and may connect components in neighboring layers having different positions in the X-Y plane. Some components in the via layer may serve additional functions such as mechanical stiffening, or as functional electronic components such as inductors or capacitors, coaxial data carriers and the like, and not merely as conductive connections between adjacent layers.

Thus with reference to the annotated schematic map of FIG. 3, different vias on the same layer may have very different sizes (and shapes). For example, a large ribbon via 302 may be a couple of millimeters long, and the smallest copper vias 304 may be about 30 microns in diameter. Some or indeed most vias may be simple vias 306 having diameters of around 60 microns, to be compatible with the current state of the art obtainable with drill & fill technology. However, it will be appreciated that the vias created by plating into photoresist or by plating and then etching, will, even when having similar dimensions, generally be smoother than those obtainable by laser drilling into heterogeneous and anisotropic dielectric layers.

Thus there is a large amount of flexibility inherent with the plate and etch and selective pattern plating technology developed by AMITEC and Access and generally described U.S. Pat. Nos. 7,682,972, 7,669,320 and 7,635,641 to Hurwitz et al., incorporated herein by reference.

For example, a 30 micron diameter via post 304 or micro-via may be positioned in proximity to a heat sink 308, which may be, relatively massive, say $150 \times 10^{-6}$ m by $150 \times 10^{-6}$ m. The typical clearance between adjacent components may be $140 \times 10^{-6}$ m or so, to keep the different components insulated from each other, but the fabrication technique also enables vias to be positioned at separations of 10 microns or less. The dielectric material 310 that separates the components may be a polymer impregnated woven glass fiber prepreg that is heated and pressed.

It will be appreciated that with drill & fill technology, it is difficult if not impossible to create adjacent features of very different sizes, since the filling of adjacent features of different sizes creates dimpling of the larger features and overfill (doming) of the smaller ones.

The flexibility inherent in the plate and etch and selective pattern plating technology developed by AMITEC and Access and generally described U.S. Pat. Nos. 7,682,972, 7,669,320 and 7,635,641 to Hurwitz et al., incorporated herein by reference, enables fabrication of specialist components, such as a via capacitor structure 312, where parallel components are in close enough proximity to store charge therebetween, and a coaxial structure 314, wherein a torroid via 316 around a regular via post 318 provides a coaxial structure through the thickness of the substrate. Also shown are bar shaped vias 320, edge stiffeners 322 and corner stiffeners 324. All the components within a common dielectric layer may be simultaneously fabricated by electrodeposition.

The smallest dimension in the X-Y plane of a first via may be significantly larger, typically 20% or more larger than the smallest dimension in the X-Y plane of a second via in the same plane. Indeed, the smallest dimension in the X-Y plane of a third via may be significantly (20% or more) larger than the smallest dimension in the X-Y plane of the first via.

Optionally, as with the prior art, the various vias may have substantially circular cross-sections in the X-Y plane. Furthermore, since the via posts are fabricated by plating into photoresist and then the dielectric is applied therearound, it is possible to achieve much smoother vias by the electroplating technology, than is achievable by drill & fill, where the heterogeneity and anisotroscopy of the dielectric may create a rough surfaced hole.

However, unlike vias created by the drill & fill technology, vias fabricated by the plating approach need not be circular. Vias may asymmetrical in the X-Y plane. They may, for example, extend in a first direction in the X-Y plane, at least three times the extension in a second direction in the X-Y plane that is perpendicular to the first direction, and be more linear.

Whereas drill & fill vias are effectively limited to about 60 microns in diameter due to the dimpling or doming effect, in some embodiments where vias are created by electroplating, at least one via has a diameter of less than 50 microns, perhaps less than 40 microns. Indeed, in some embodiments, at least one via has a diameter of 30 microns or less. Micro-vias 306 of diameter 30 microns are illustrated in FIG. 3 and have been fabricated by electroplating, as shown in FIG. 2.

Since the via layer is generally covered with a feature layer that is deposited with a plating technology onto a dielectric, to enable plating onto the dielectric, typically at least one via layer may comprise a seed layer, such as copper, covered by a metal layer, such as copper, deposited thereover by electroplating. The seed layer is typically 0.5 microns to 1.5 microns thick. Furthermore, to aid adhesion of the seed layer to the underlying dielectric, a first adhesion layer may be applied. The adhesion layer may be fabricated from titanium, chromium, tantalum, tungsten or a mixture of these metals, and is typically very thin. The adhesive layer may be 0.04 microns to 0.1 microns thick, for example.

Figure 4:
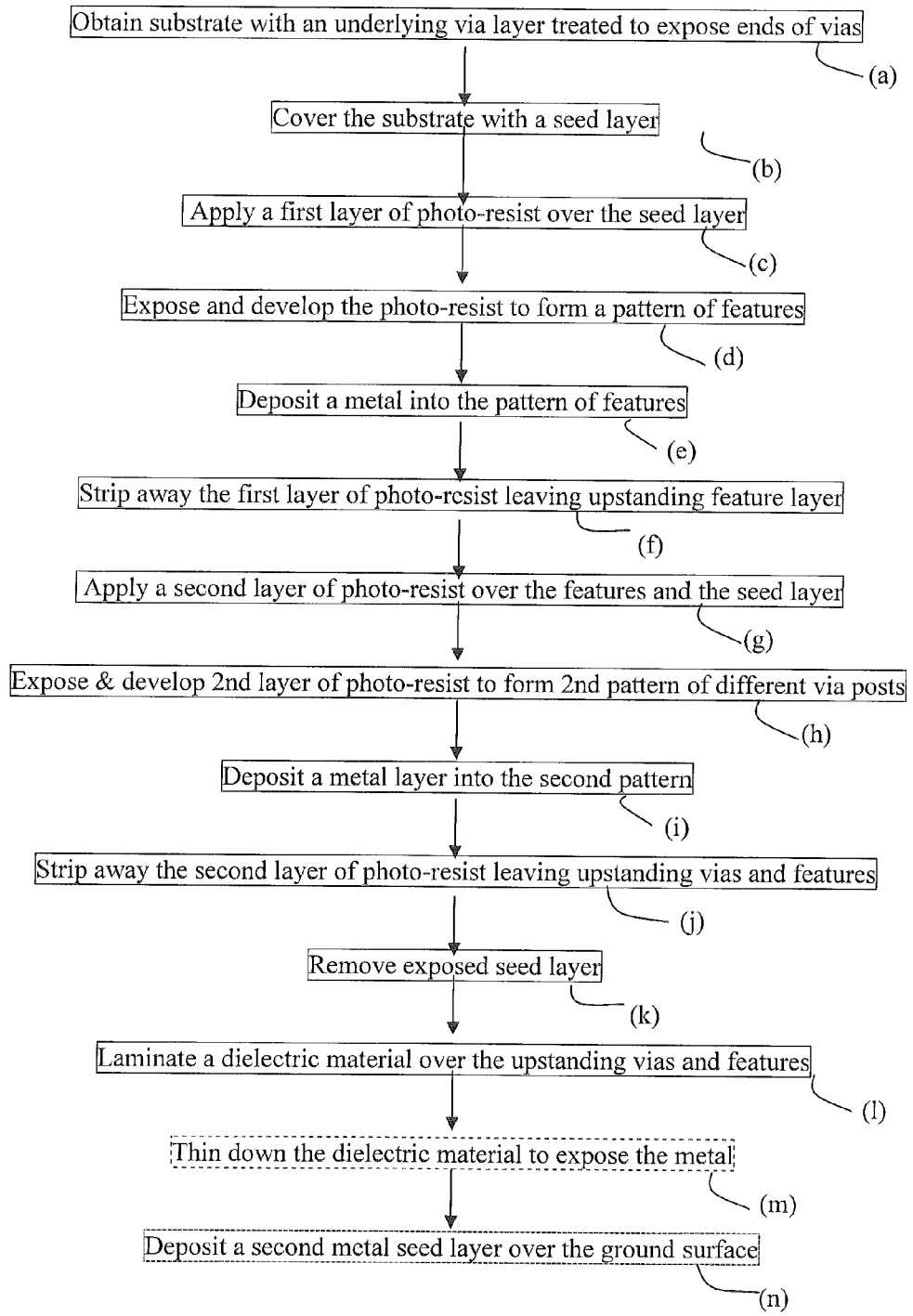
FIG. 4 is one flowchart showing one process by which structures of the invention may be fabricated.

Referring to FIG. 4, in some embodiments, the at least one via layer is fabricated by a process consisting of the following steps: obtaining a substrate including an underlying via layer that is treated to expose the copper thereof—step (a), and covering the substrate with a seed layer, typically copper—step (b). A first, thin layer of photoresist is applied over the seed layer—step (c), and the first, thin layer of photoresist is exposed and developed to form a negative pattern of features—step (d). A metal, typically copper, is deposited into the negative pattern of features—step (e), and the first thin layer of photoresist is stripped away—step (f) leaving the layer of features upstanding. A second, thicker layer of photoresist is now applied—step (g) and a second negative pattern of via posts is exposed and developed therein—step (h). A layer of metal, typically copper, is deposited in the trenches developed in the second pattern—step (i) to fabricate a via layer that includes via posts of different dimensions. The second layer of photoresist is stripped away—step (j) leaving the layer of via posts including at least two via posts of different dimensions, and the feature layer upstanding. The exposed seed layer is now removed—step (k). This may be accomplished by exposing the structure to a wet etch of ammonium hydroxide or copper chloride, for example. A dielectric material is then laminated over the via layer including via posts of different dimensions—step (l).

The dielectric material is generally a composite material comprising a polymer matrix, such as polyimide, epoxy, Bismaleimide, Triazine and blends thereof, and may further comprise ceramic or glass. Typically the dielectric is provided as a prepreg consisting of woven glass fiber bundles in a polymer resin pre-preg with ceramic fillers.

To enable further build up of additional layers, the dielectric material may be thinned to expose the metal—step (m). The thinning may be accomplished using mechanical grinding or polishing, chemical polishing, or chemical mechanical polishing CMP. The thinning also planarizes the structure. Then a metal seed layer, such as copper, may be deposited over the thinned surface—step (n), to enable further layers to be built up. The seed layer is typically 0.5 microns—to 1.5 microns. To aid its adhesion, an adhesive layer of titanium, tantalum, chromium, tungsten or mixtures thereof, typically being 0.04 to 0.1 microns thick, may be first deposited. The seed layer may be deposited using sputtering or electroless plating, for example.

Figure 5:
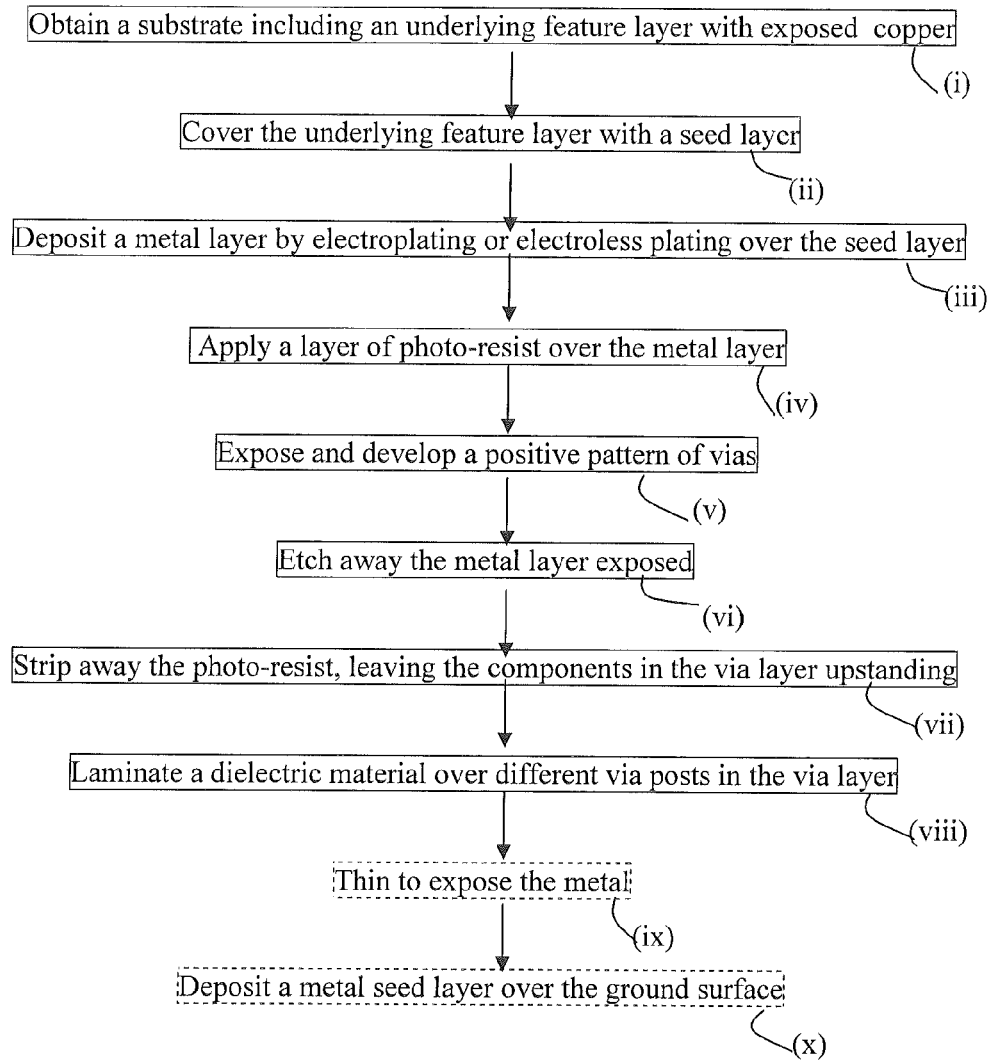
FIG. 5 is a second flowchart showing a variant process by which structures of the invention may be fabricated.

Referring to FIG. 5, in a variant fabrication route, the at least one via layer is fabricated by the steps of: obtaining a substrate including an underlying feature layer that is planarized to expose the copper thereof—step (i), and covering the underlying feature layer with a seed layer—step (ii) which is typically copper and is typically deposited by sputtering or by electroless plating. A metal layer is deposited over the seed layer—step (iii). This metal layer is typically copper, and may be deposited by electroplating. A layer of photoresist is laid down over the metal layer—step (iv), and a positive pattern of via posts is exposed and developed therein, where two or more via posts may have different in-plane dimensions—step (v). The metal layer exposed is etched away—step (vi). The etching away of copper may be performed using a copper etchant, such as ammonium hydroxide or copper chloride, for example. The photoresist is then stripped away—step (vii), leaving the at least one component in the via layer upstanding, and a dielectric material is laminated over the at least one component in the via layer—step (viii).

To enable further build up, the dielectric layer may be thinned—step (ix) to expose the metal, using chemical or mechanical polishing or grinding, or chemical mechanical polishing, for example. The thinning planarizes the layer.

Then a metal seed layer, such as copper, may be deposited—step (x) over the thinned surface.

The above description is provided by way of explanation only. It will be appreciated that the present invention is capable of many variations.

Several embodiments of the present invention have been described. Nevertheless, it will be understood that various modifications may be made without departing from the spirit and scope of the invention. Accordingly, other embodiments are within the scope of the following claims.

Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising", "included" and the like indicate that the components listed are included, but not generally to the exclusion of other components.

What is claimed is:

1. A multilayer electronic interconnect support structure for coupling to a chip, comprising at least two feature layers extending in an X-Y plane and separated by a via layer comprising a dielectric material comprising a polymer matrix that is sandwiched between two adjacent feature layers, the via layer comprising a plurality of via posts that couple adjacent feature layers in a Z direction perpendicular to the X-Y plane, wherein a first via post in the via layer has different dimensions in the X-Y plane from a second via post in the via layer.

2. The multilayer electronic support structure of claim 1, wherein one of said first via post and second via post is not substantially cylindrical in shape.

3. The multilayer electronic support structure of claim 1, wherein the at least one via comprises a seed layer and a metal layer electroplated over the seed layer.

4. The multilayer electronic support structure of claim 3, wherein the seed layer comprises copper.

5. The multilayer electronic support structure of claim 4, wherein the seed layer further comprises an underlying adhesive metal layer comprising at least one of the group consisting of titanium, chromium, tantalum and tungsten.

6. The multilayer electronic support structure of claim 3, wherein the metal layer comprises copper.

7. The multilayer electronic support structure of claim 1, wherein the smallest dimension in the X-Y plane of a first via post is at least 20% larger than the smallest dimension in the X-Y plane of a second via post in the same via layer.

8. The multilayer electronic support structure of claim 7, wherein a smallest dimension in the X-Y plane of a third via post is at least 20% larger than the smallest dimension in the X-Y plane of the first via post.

9. The multilayer electronic support structure of claim 1, wherein at least one via post has a substantially circular cross section.

10. The multilayer electronic support structure of claim 1, wherein at least one via post has a square cross-section.

11. The multilayer electronic support structure of claim 1, wherein at least one via post is asymmetrical in the X-Y plane, having a linear shape.

12. The multilayer electronic support structure of claim 1, wherein at least one via post is asymmetrical in the X-Y plane, extending in a first direction in the X-Y plane, at least three times the extension in a second direction in the X-Y plane that is perpendicular to the first direction.

13. The multilayer electronic support structure of claim 1, wherein at least one via post has a diameter of less than 50 microns.

14. The multilayer electronic support structure of claim 1 wherein, at least one via post has a diameter of less than 40 microns.

15. The multilayer electronic support structure of claim 1 wherein at least one via post has a diameter of 30 microns or less.

16. The multilayer electronic support structure of claim 1, wherein a feature layer and the at least one via layer are fabricated by a process comprising the steps of:
(a) obtaining a substrate including an underlying via layer that is treated to expose the copper thereof;
(b) depositing a seed layer over the underlying via layer;
(c) applying a first layer of photoresist over the seed layer;
(d) exposing and developing the first layer of photoresist to form a negative pattern;
(e) depositing a metal layer into the negative pattern;
(f) stripping away the first layer of photoresist leaving the feature layer upstanding;
(g) laying down a second layer of photoresist;
(h) exposing and developing the second layer of photoresist to create a negative pattern including a via layer comprising at least two vias posts of different in-plane dimensions;
(i) depositing a metal layer into the pattern in the second layer of photoresist;
(j) stripping away the second layer of photoresist;
(k) removing the exposed seed layer, and
(l) laminating a dielectric material over the at least two vias posts of different in-plane dimensions.

17. The multilayer electronic support structure of claim 16, wherein the process further comprises: (m) thinning the dielectric to expose the metal.

18. The multilayer electronic support structure of claim 17, wherein the process further comprises: (n) depositing a metal seed layer over the thinned surface.

19. The multilayer electronic support structure of claim 1, wherein the at least one via layer is fabricated by a process including the steps of:
(i) obtaining a substrate including an underlying feature layer that is treated to expose the copper thereof;
(ii) covering the underlying feature layer with a seed layer;
(iii) depositing a metal layer over the seed layer;
(iv) applying a layer of photoresist over the metal layer;
(v) exposing a positive pattern of vias;
(vi) etching away the exposed metal layer and seed layer;
(vii) stripping away the photoresist, leaving at least two components in the via layer having different in plane dimensions, and
(viii) laminating a dielectric material over the at least two components in the via layer.

20. The multilayer electronic interconnect support structure for coupling to a chip of claim 1, selected from the group consisting of IC substrates and IC interposers.

* * * * *